(12) United States Patent
Wang et al.

(10) Patent No.: US 11,529,700 B2
(45) Date of Patent: Dec. 20, 2022

(54) SYSTEMS AND METHODS FOR LASER DICING OF BONDED STRUCTURES

(71) Applicant: YANGTZE MEMORY TECHNOLOGIES CO., LTD., Wuhan (CN)

(72) Inventors: Feiyan Wang, Wuhan (CN); Xianbin Wang, Wuhan (CN); Yongwei Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 323 days.

(21) Appl. No.: 16/543,228

(22) Filed: Aug. 16, 2019

(65) Prior Publication Data

US 2020/0398371 A1    Dec. 24, 2020

Related U.S. Application Data

(63) Continuation of application No. PCT/CN2019/092014, filed on Jun. 20, 2019.

(51) Int. Cl.
*B23K 26/0622* (2014.01)
*B23K 26/035* (2014.01)
(Continued)

(52) U.S. Cl.
CPC ........ *B23K 26/0624* (2015.10); *B23K 26/035* (2015.10); *B23K 26/082* (2015.10); *B23K 26/36* (2013.01)

(58) Field of Classification Search
CPC .............. B23K 26/0624; B23K 26/082; B23K 26/035; B23K 26/36
(Continued)

(56) References Cited

U.S. PATENT DOCUMENTS

| 6,833,234 B1 * | 12/2004 | Bloomstein ............. B29C 64/40 |
| | | 264/401 |
| 9,138,913 B2 | 9/2015 | Arai et al. |

(Continued)

FOREIGN PATENT DOCUMENTS

| CN | 1757479 A | 4/2006 |
| CN | 103567630 A | 2/2014 |

(Continued)

OTHER PUBLICATIONS

International Search Report issued in corresponding International Application No. PCT/CN2019/092014, dated Mar. 19, 2020, 5 pages.

(Continued)

*Primary Examiner* — Thien S Tran
(74) *Attorney, Agent, or Firm* — Bayes PLLC

(57) ABSTRACT

Embodiments of systems and methods for dicing a bonded structure are provided. A method includes the following operations. First, a scan pattern can be determined for forming a series of ablation structures in the bonded structure. Relative positions between the series of ablation structures and a bonding interface of the bonded structure can then be determined. The bonding surface may be between a first wafer and a second wafer. At least one of one or more focal planes or a depth of focus of a laser beam may be determined based on the relative positions between the series of ablation structures and the bonding interface. Further, the laser beam may be determined. The laser beam has a series of pulsed lasers. Further, the laser beam may be moved in the bonded structure according to the scan pattern to form the series of ablation structures in the bonded structure.

20 Claims, 10 Drawing Sheets

(51) Int. Cl.
*B23K 26/082* (2014.01)
*B23K 26/36* (2014.01)

(58) Field of Classification Search
USPC ............. 219/121.67, 121.69, 121.71, 121.72
See application file for complete search history.

(56) References Cited

U.S. PATENT DOCUMENTS

| | | | | |
|---|---|---|---|---|
| 2007/0111481 | A1* | 5/2007 | Tamura | B23K 26/53 |
| | | | | 438/463 |
| 2012/0138586 | A1* | 6/2012 | Webster | B23K 15/02 |
| | | | | 219/121.64 |
| 2015/0166391 | A1* | 6/2015 | Marjanovic | C03B 33/07 |
| | | | | 428/43 |
| 2018/0236597 | A1* | 8/2018 | Okuma | B23K 26/032 |

FOREIGN PATENT DOCUMENTS

| | | |
|---|---|---|
| CN | 106354319 A | 1/2017 |
| JP | 2004337902 A | 12/2004 |
| JP | 2010177341 A | 8/2010 |
| JP | 2014028388 A | 2/2014 |
| JP | 2017033972 A | 2/2017 |
| KR | 100824962 B1 | 4/2008 |
| TW | 200822202 A | 5/2008 |

OTHER PUBLICATIONS

Written Opinion of the International Searching Authority issued in corresponding International Application No. PCT/CN2019/092014, dated Mar. 19, 2020, 5 pages.

Extended European Search Report issued in corresponding European Application No. 19933496.2, dated Jul. 26, 2022, 9 pages.

* cited by examiner

SYSTEMS AND METHODS FOR LASER DICING OF BONDED STRUCTURES

CROSS REFERENCE TO RELATED APPLICATION

This application is continuation of International Application No. PCT/CN2019/092014, filed on Jun. 20, 2019, entitled "SYSTEMS AND METHODS FOR LASER DICING OF BONDED STRUCTURES," which is hereby incorporated by reference in its entirety.

BACKGROUND

Embodiments of the present disclosure relate to systems and methods for laser dicing of bonded structures.

In semiconductor manufacturing, wafers are diced to separate dies that form integrated circuits. Common ways to dice wafers include mechanical sawing and laser dicing. The mechanical sawing methods often includes employing a dicing saw to mechanically separate different dies in a wafer. The laser dicing methods often include directing the output of an ultra-short and pulsed high-power laser through optics. A dicing process can produce individual circuit chips that are further packaged to form desired circuits.

SUMMARY

Embodiments of systems and methods for laser dicing of bonded structures.

In one example, a method for dicing a bonded structure includes the following operations. First, a scan pattern can be determined for forming a series of ablation structures in or near the bonded structure. Relative positions between the series of ablation structures and a bonding interface of the bonded structure can then be determined. The bonding surface may be between a first wafer and a second wafer. At least one of one or more focal planes or a depth of focus of a laser beam may be determined based on the relative positions in or near the ablation structures and the bonding interface. Further, the laser beam may be determined. The laser used is a kind of pulsed laser. Further, the laser beam may be moved in the bonded structure according to the scan pattern to form the series of ablation structures in the bonded structure.

In another example, a method for dicing a bonded structure includes thinning a top surface and a bottom surface of a bonded structure. The bonded structure may have a first wafer and a second wafer bonded with a bonding interface. The method may also include forming a series of ablation structures in the first wafer and the second wafer. The series of ablation structures may be between a first part and a second part of the bonded structure. The method may also include separating the first part and the second part of the bonded structure along the series of ablation structures.

In a different example, a laser dicing system for dicing a bonded structure includes a laser source configured to generate a series of pulsed lasers, an optical module coupled to the laser source, configured to provide a series of focused laser spots, and a controller coupled to the laser source and the optical module. The controller may be configured to move the series of focused laser spots in the bonded structure to form a series of ablation structures in a first and a second wafers in the bonded structure. The first wafer and a second wafer may have a bonding interface in between.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
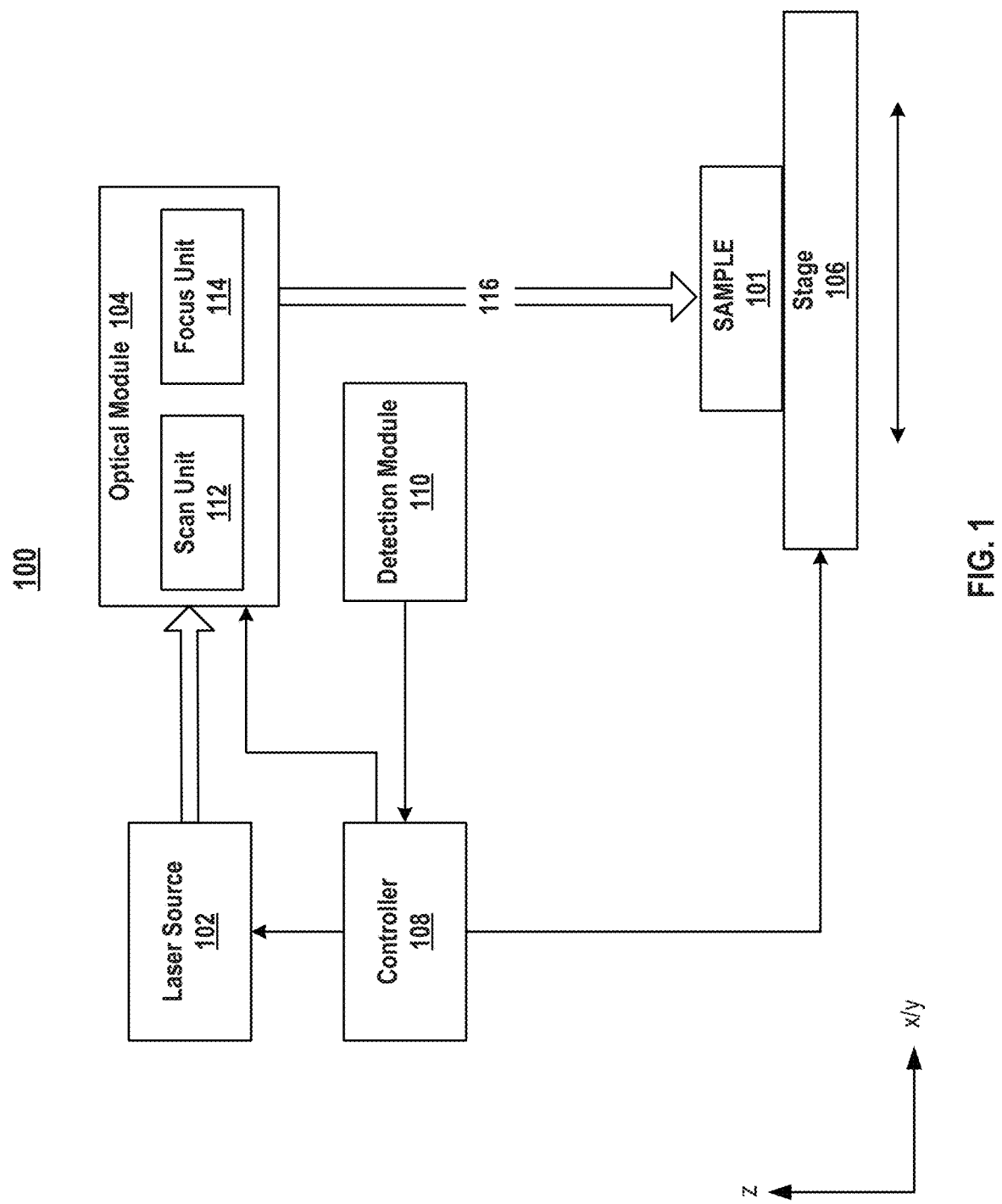
FIG. 1 illustrates a schematic diagram of an exemplary system for laser dicing of a bonded structure, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In existing laser dicing systems, wafers are often thinned before diced. For example, the wafers can be thinned down to dozens of microns for a wafer dicing process. Thinned wafers can be fragile using conventional mechanical sawing method and laser ablation method, reducing the production yield. For example, a mechanical sawing method often involves the usage of a mechanical saw/blade to press against a wafer. The dicing process can generate high heat, which requires cooling means (e.g., cooling water) to prevent the wafer from overheating. It can also cause chipping and debris on the wafer surface. A laser ablation method works by carving a groove while melting/vaporizing the wafer surface using a laser beam. Thermal damages and debris can be formed on the wafer surface as a result of the melting/vaporizing surface. The cleaning of the wafer can increase fabrication cost and the wasted areas can affect production yield. To improve the dicing process, stealth dicing, e.g., the use of a laser beam to form a stealth dicing layer inside a wafer and separating the wafer along the SD layer using external force, is used to reduce damages to the wafer and cost of fabrication. However, the existing stealth dicing method is limited to dicing of single wafers.

Various embodiments in accordance with the present disclosure provide system and methods for laser dicing a bonded structure. Using the system and methods of the present disclosure, a bonded structure with two or more bonded wafers can be diced and separated with more uniform cross-sections and less damaged and wasted areas on the surface of the bonded surface. The ablation structures formed in the bonded structure may be in the two or more bonded wafers and may be aligned with one another along the vertical direction (e.g., the z-axis), providing more uniform cross-sections when the bonded structure is separated after the dicing process. In one embodiment, the focal plane of the laser beam can be adjusted so the laser beam can be focused on a respective cutting level of each wafer. As the laser beam continues to move horizontally in the bonded structure, ablation structures can be formed horizontally along each cutting level in the bonded structure. In another embodiment, the focal plane of the laser is located at a bonding interface between the two bonded wafers. The laser beam has a depth of focus that covers the distance from the bonding interface to the cutting levels of the two bonded wafers. Laser energy can distribute vertically along the depth of focus so an ablation structure (e.g., ablation stripe/groove), in both bonded wafers and across the bonding interface, can be formed when the laser beam is focused at the bonding interface. The laser beam can move horizontally while being focused on the bonding interface, and a plurality of ablation stripes can be formed in the bonded wafers and across the bonding interface. An external lateral force can be applied on the diced bonded wafers to separate the parts along the ablation structures.

The disclosed system and methods have many advantages over conventional dicing methods. For example, no cooling water is needed for the cooling of the dicing process. Because the ablation structures are formed in the bonded structure, little or no debris is formed. Uneven stress and shock caused by the movement of saws/blades can be avoided. Fewer damages are made to the wafers. Scratches resulted from the dicing process can be controlled below a few microns, increasing the usable area on the wafers. Also, the dicing of the bonded wafers can be or almost be simultaneous, so the bonded wafers can be separated after one dicing process, thereby decreasing the dicing time compared to methods that cut the bonded wafers separately.

FIG. 1 illustrates a schematic diagram of an exemplary system 100 for laser dicing of a bonded structure, according to some embodiments of the present disclosure. System 100 can include a laser source 102, an optical module 104, a stage 106, and a controller 108. Laser source 102 can be any suitable type of laser source including, but not limited to, fiber lasers, solid-state lasers, gas lasers, and semiconductor lasers. Laser source 102 can be configured to generate a laser beam 116 that includes a series of pulsed lasers at any suitable wavelengths, which should be a permeable wavelength not strongly absorbed or reflected by the bonded structure. In the case of silicon wafer cutting, the wavelength may be longer than 1 μm to realize the internal laser ablation, making full use of the laser energy and avoiding any damage to the upper part of the wafer when a focused laser beam creates dicing trace inside the bonded structure.

In some embodiments, laser beam 116 generated by laser source 102 has a single wavelength, or a plurality of wavelengths, such as two or three different wavelengths. Laser beam 116 having different wavelengths can be separately, simultaneously, or alternatingly generated. In some embodiments, the wavelength of the laser beam 116 generated by laser source 102 may be longer than 1 μm. In some embodiments, the output frequency of laser source 102 is between 10 kHz and 1,000 kHz. In some embodiments, the average output power of laser source 102 is between 5 W and 500 W. It is understood that the parameters of laser beam 116 and laser source 102 disclosed above are for illustrative purposes only.

Optical module 104 can be optically coupled to laser source 102 and include a scan unit 112 and a focus unit 114. Optical module 104 can be configured to provide a series of focused laser spots on a sample 101 based on the series of pulsed lasers generated by laser source 102. For example, the series of pulsed lasers can form a series of focused laser spots at a horizontal location on a focal plane. In some embodiments, optical module 104 is operatively coupled to controller 108 and receives control signals and instructions from controller 108. Scan unit 112 can be configured to, based on the control of controller 108, change directions in which at least some of the laser beam 116 emit to sample 101. That is, scan unit 112 can scan the laser beam 116 within a scan angle at a scan rate, as controlled by controller 108, toward sample 101. In some embodiments, scan unit 112 includes a galvanometer and/or a polarizer. Scan unit 112 can further include any other suitable scanning mirrors and scanning refractive optics.

Focus unit 114 can be configured to focus each of the laser beam 116 to form a series of focused laser spots. In some embodiments, focus unit 114 includes one or more focusing lens through which the focal plane of the laser beam 116 is determined at a desired position along the z-axis (e.g., the vertical direction). In some embodiments, the one or more focusing lenses are electrically and mechanically coupled to controller 108 so controller 108 can control the arrangement (e.g., orientation and distance in between) of the one or more focusing lens to allow the focal plane of laser beam 116 to be located at the desired position along the z-axis. The series of focused laser spots can be formed on the focal plane, forming ablation structures in sample 101. In some embodiments, a dimension of each of the focused laser spots is preferably between 0.2 .micrometer (μm) and 5 μm, such as 0.2 μm, 0.5 μm, 1 μm, 2 μm, 3 μm, 4 μm, 5 μm, any range bounded by the lower end by any of these values, or in any range defined by any two of these values. The shape of each focused laser spot can include, for example, round, rectangle, square, irregular, or any suitable shapes. In some embodiments, each focused laser spot has a substantially round shape with a diameter between 1 μm and 5 μm. It is understood that the dimensions of a series of focused laser spots can be substantially the same or different. By focusing the beams of laser beam 116 into focused laser spots, the energy density can be significantly increased.

Stage 106 can be configured to hold sample 101. In some embodiments, stage 106 includes a wafer holder or any suitable stage for holding sample 101 during the dicing process. In some embodiments, stage 106 is further configured to, based on the control of controller 108, move horizontally (e.g., along the x-axis and/or the y-axis, as illustrated by the arrows in FIG. 1) so that optical module 104 can, based on relative horizontal movement between laser beam 116 and sample 101, scan laser beam 116 along the x-axis and/or the y-axis. In some embodiments, controller 108 may control stage 106 to move at a desired speed to allow the series of focused laser spots to converge at each location in sample 101 (e.g., forming a series of focused laser spots) to be sufficiently long so that ablation structures of desired dimensions can be formed. In some embodiments, stage 106 is configured to move vertically along the z-axis as well.

Controller 108 can be operatively coupled to laser source 102, optical module 104, and/or stage 106 and control the operations of laser source 102, optical module 104, and/or stage 106 via control signals and instructions. In some embodiments, controller 108 is configured to cause relative horizontal movement between optical module 104 and stage 106 so laser beam 116 can scan following a scan pattern in sample 101. In some embodiments, the scan pattern may be a pattern that laser beam 116 moves and converges, forming the series of focused laser spots for separating two parts (e.g., two dies) of sample 101. In other words, the scan pattern represents an order a series of ablation structures are formed (e.g., by the series of focused laser spots). For example, the scan pattern may be a path between two parts to be separated by the laser dicing process. A series of ablation structures can be formed (e.g., by the series of focused laser spots) along the scan pattern between the two parts in sample 101. In some embodiments, the order the series of ablation structures are formed is at least dependent on the direction in which laser beam 116 moves and converges along the scan pattern. The two parts may subsequently be separated at the vertical plane in which the series of ablation structures are located. For example, controller 108 may transmit control signals and instructions to optical module 104 and stage 106 so that optical module 104 scans laser beam 116 when stage 106 moves horizontally. The control signals can control the laser beam to converge at different focal planes at one horizontal location in sample 101 or converge at a single focal plane in sample 101. Controller 108 is also configured to control the moving direction and speed of stage 106 and the power density of a series of focused laser spots formed by laser beam 116. The scan pattern can be determined by executing a computer program or manually determined by an operator.

As shown in FIG. 1, in some embodiments, system 100 further includes a detection module 110 configured to monitor sample 101 during operation. In some embodiments, detection module 110 includes a camera and/or a thermal camera that can record videos and/or images of sample 101. In some embodiments, controller 108 is coupled to detection module 110 so monitoring data (e.g., images) is transmitted from detection module 110 to controller 108 in real-time. In some embodiments, the monitoring data includes relative horizontal movement between sample 101 and the series of pulsed lasers, and size and/or shape of the ablation structures. In some embodiments, detection module 110 includes a laser power meter that detects the real-time power density of the series of focused laser spots and transmits it to controller 108. Controller 108 may adjust the power of laser source 102 and/or arrangement of optical module 104 so the power density of the series of focused laser spots, and the size and shape of ablation structures can reach their respective desired values. Controller 108 and/or an operator can then monitor the operation (e.g., the scan pattern and/or power density of the series of focused laser spots) in real-time. It is understood that detection module 110 can be part of system 100 or a standalone device separate from system 100.

In some embodiments, system 100 further includes a calibration unit (not shown) configured to calibrate positions of the focused laser spots (e.g., formed by the series of pulsed lasers when focusing on a focal plane) in sample 101. Controller 108 can be configured to control stage 106 to move the series of focused laser spots in sample 101 based on the calibration performed by the calibration unit.

Figure 2:
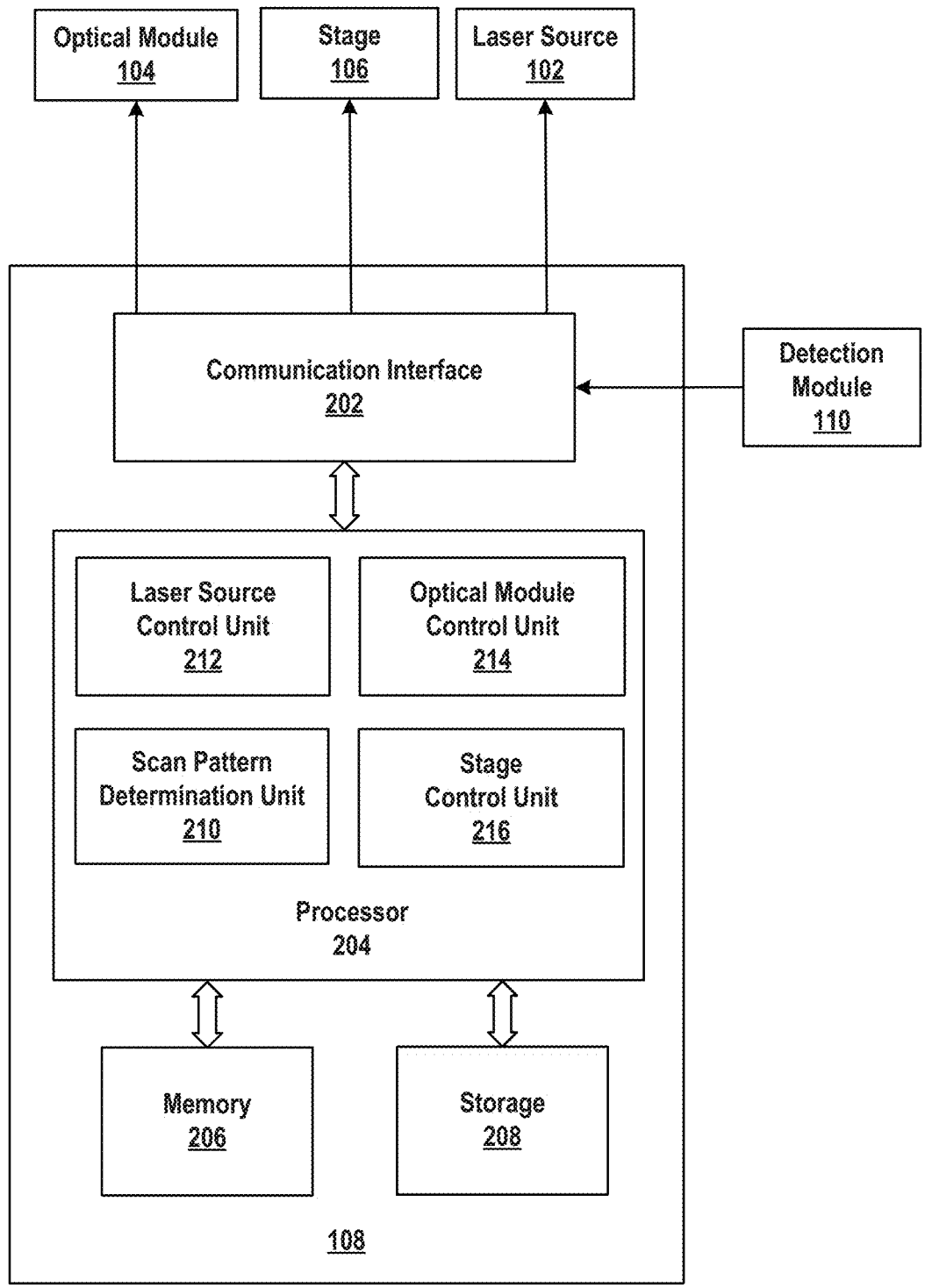
FIG. 2 illustrates a schematic diagram of an exemplary controller, according to some embodiments of the present disclosure.

FIG. 2 illustrates a schematic diagram 200 of exemplary controller 108, according to some embodiments of the present disclosure. Controller 108 can control operations of laser source 102, optical module 104, and/or stage 106, for example, generate, converge, and move laser beam 116 in sample 101 to follow a scan pattern. In some embodiments, controller 108 receives detection data indicative of status of the dicing operation of sample 101 and provides control instruction indicative of the operation on sample 101 (e.g., scan pattern, moving speed of the series of pulsed lasers, and/or diced/remaining portion in sample 101) based on the detection data to laser source 102, optical module 104, and/or stage 106.

As shown in FIG. 2, controller 108 can include a communication interface 202, a processor 204, a memory 206, and a storage 208. In some embodiments, controller 108 has different modules in a single device, such as an integrated circuit (IC) chip (implemented as an application-specific integrated circuit (ASIC) or a field-programmable gate array (FPGA), or separate devices with dedicated functions. One or more components of controller 108 can be located along with laser source 102 and/or optical module 104 as part of system 100, or can be alternatively in a standalone computing device, in the cloud, or another remote location. Components of controller 108 can be in an integrated device or distributed at different locations but communicate with each other through a network (not shown). For example, processor 204 can be a processor-on-board, a processor inside a standalone computer, or a cloud processor, or any combinations thereof.

Communication interface 202 may send data to and receive data from components such as laser source 102, optical module 104, stage 106, or detection module 110 via communication cables, a Wireless Local Area Network (WLAN), a Wide Area Network (WAN), wireless networks such as radio waves, a nationwide cellular network, and/or a local wireless network (e.g., Bluetooth™ or WiFi), or other communication methods. In some embodiments, communication interface 202 can be an integrated services digital network (ISDN) card, cable modem, satellite modem, or a modem to provide a data communication connection. As another example, communication interface 202 can be a local area network (LAN) card to provide a data communication connection to a compatible LAN. Wireless links can also be implemented by communication interface 202. In such an implementation, communication interface 202 can send and receive electrical, electromagnetic or optical signals that carry digital data streams representing various types of information via a network.

Processor 204 can include any appropriate type of general-purpose or special-purpose microprocessor, digital signal processor, or microcontroller. Processor 204 can be configured as a separate processor module dedicated to controlling laser source 102, optical module 104, and stage 106. Alternatively, processor 204 can be configured as a shared processor module for performing other functions unrelated to controlling laser source 102, optical module 104, and stage 106.

As shown in FIG. 2, processor 204 can include multiple modules, such as a scan pattern determination unit 210, a laser source control unit 212, an optical module control unit 214, a stage control unit 216, and the like. These modules (and any corresponding sub-modules or sub-units) can be hardware units (e.g., portions of an integrated circuit) of processor 204 designed for use with other components or to execute a part of a program. The program can be stored on a computer-readable medium, and when executed by processor 204, it may perform one or more functions. Although FIG. 2 shows units 210-216 all within one processor 204, it is contemplated that these units may be distributed among multiple processors located near or remotely with each other.

Scan pattern determination unit 210 can be configured to determine the scan pattern to form a series of ablation structures. In some embodiments, scan pattern determination unit 210 determines the scan pattern based on the locations and dimensions of the dies to be separated in sample 101, the number of cutting levels in sample 101, the power density of the series of focused laser spots on the focal plane, the depth of focus of the series of pulsed lasers, etc. The scan pattern can also be manually determined by an operator. Specifically, scan pattern determination unit 210 can determine the size and/or shape of the series of focused laser spots and the order the series of ablation structures are formed in sample 101. For example, based on the number of cutting levels in sample 101, scan pattern determination unit 210 may determine the focal planes on which laser beam 116 converges and the order the series of ablation structures are formed when stage 106 moves horizontally. In an example, the scan pattern can include an order to form a plurality of rows of spots each distributed in a wafer of sample 101 and aligned with one another along the vertical direction. In another example, the scan pattern can include an order a plurality of stripes, aligned vertically, across a bonding interface of sample 101. Detailed descriptions of the scan pattern will be described in FIGS. 3D and 3E below.

Laser source control unit 212 can be configured to provide a control instruction to laser source 102 indicative of the scan pattern. The control instruction can cause laser source 102 to initialize and adjust various parameters associated with the series of pulsed lasers based on the scan pattern prior to and during the laser dicing operation. In some embodiments, the power of laser source 102 is controlled by laser source control unit 212 to affect the size, shape, and or depth of focus of the series of focused laser spots when laser beam 116 converges on a focal plane. For example, compared to forming ablation structures respectively along two cutting depths in sample 101 (e.g., referring to the example shown in FIG. 3A), if the scan pattern corresponds to an order to form ablation structures extending between two cutting levels of sample 101 (e.g., referring to the example shown in FIG. 3B), laser source control unit 212 may provide higher power so sufficient laser energy can be distributed in the area where the ablation structures are formed. In another example, laser source control unit 212 may provide a constant power regardless of the number of cutting levels in sample 101. The power of laser source 102 may be sufficient to cause the formation of ablation structures in sample 101.

Optical module control unit 214 can be configured to provide a control instruction to optical module 104 indicative of the scan pattern. The control instruction can cause optical module 104 to initialize and adjust the arrangement of optical components in optical module 104. The optical components may include one or more focusing lens each facing a desired direction for shaping and focusing laser beam 116 in sample 101 to form the series of focused laser spots on a focal plane. Optical module control unit 214 may control the position of each focusing lens, the orientation of each focusing lens, and/or a distance between two focusing lenses so laser beam 116 can converge on desired focal planes (e.g., forming the series of focused laser spots) with desired power density. In some embodiments, optical module control unit 214 adjusts the position of one or more focusing lens, the orientation of one or more focusing lens, and/or a distance between two focusing lenses to change the focal plane of laser beam 116 during a dicing operation or to change the depth of focus of laser beam 116.

Stage control unit 216 can be configured to provide a control instruction to stage 106 indicative of the scan pattern. The control instruction can cause stage 106 to move, e.g., horizontally, along a desired direction in accordance with the scan pattern. Stage 106 may move at a desired speed and/or repetition of the pulsed lasers, which can in turn affect the power density of the series of focused laser spots on a focal plane.

Memory 206 and/or storage 208 can include any appropriate type of mass storage provided to store any type of information that processor 204 may need to operate. Memory 206 and storage 208 can be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. Memory 206 and/or storage 208 can be configured to store one or more computer programs that may be executed by processor 204 to perform laser source 102, optical module 104, and stage 106 control functions disclosed herein. For example, memory 206 and/or storage 208 can be configured to store program(s) that may be executed by processor 204 to control operations of laser source 102, optical module 104, and stage 106, and process the data to generate control instructions and any other control signals.

Memory 206 and/or storage 208 can be further configured to store information and data used by processor 204. For example, memory 206 and/or storage 208 can be configured to store parameters for controlling the power of laser source 102 and the arrangement of optical module 104. The various types of data may be stored permanently, removed periodically, or disregarded immediately after each detection and/or scan.

Figure 3A:
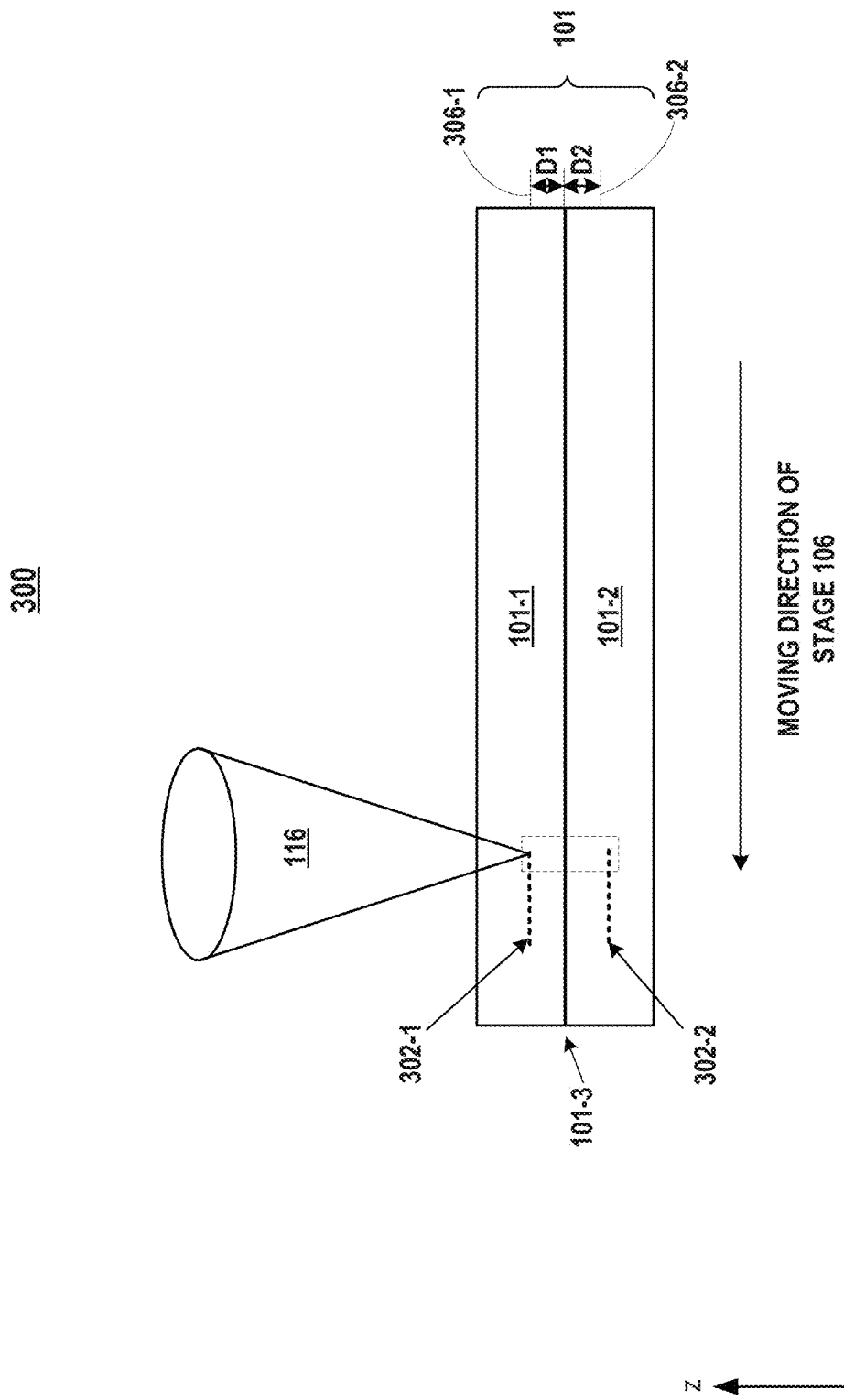
FIG. 3A illustrates an exemplary laser dicing process, according to some embodiments of the present disclosure.
Figure 3B:
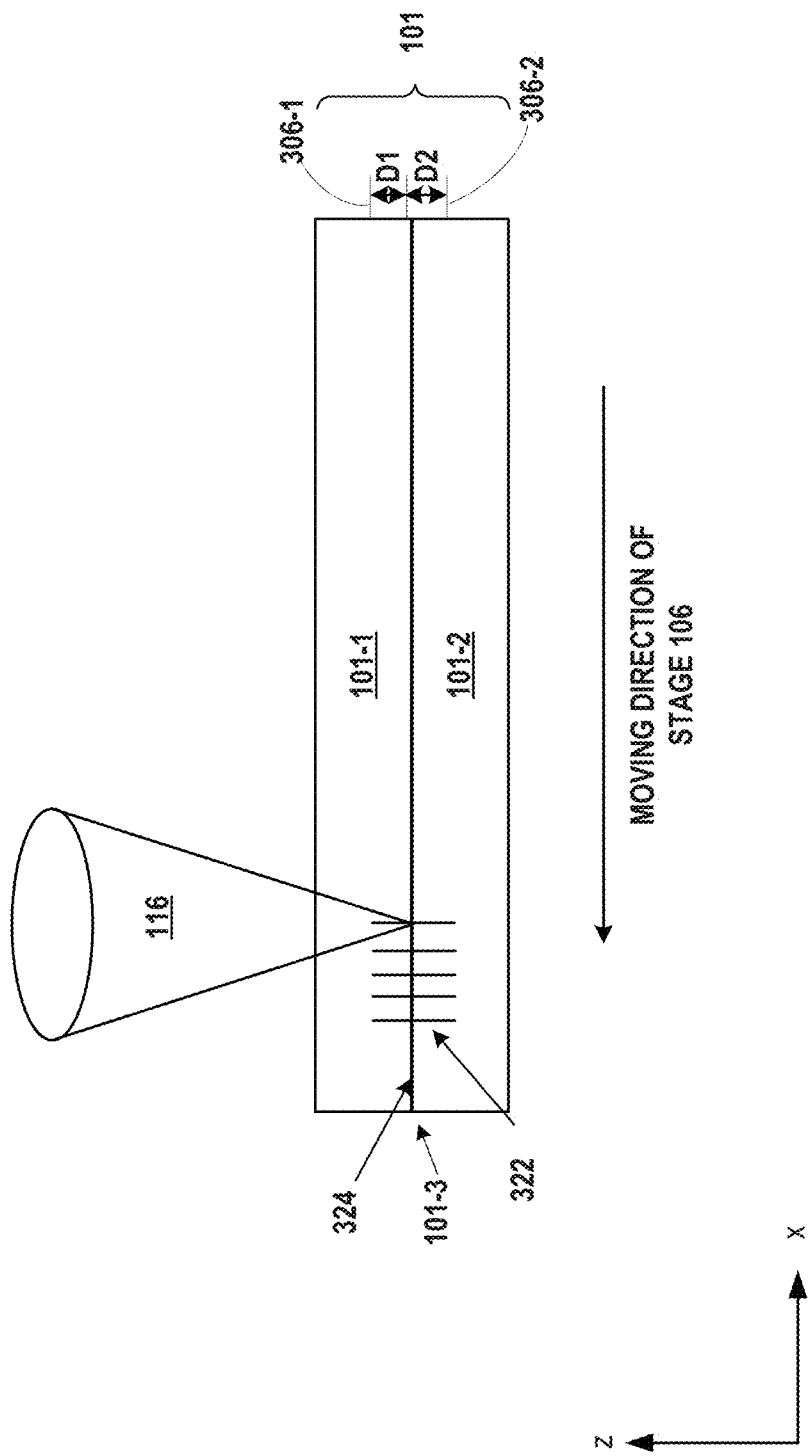
FIG. 3B illustrates another exemplary laser dicing process, according to some embodiments of the present disclosure.
Figure 3C:
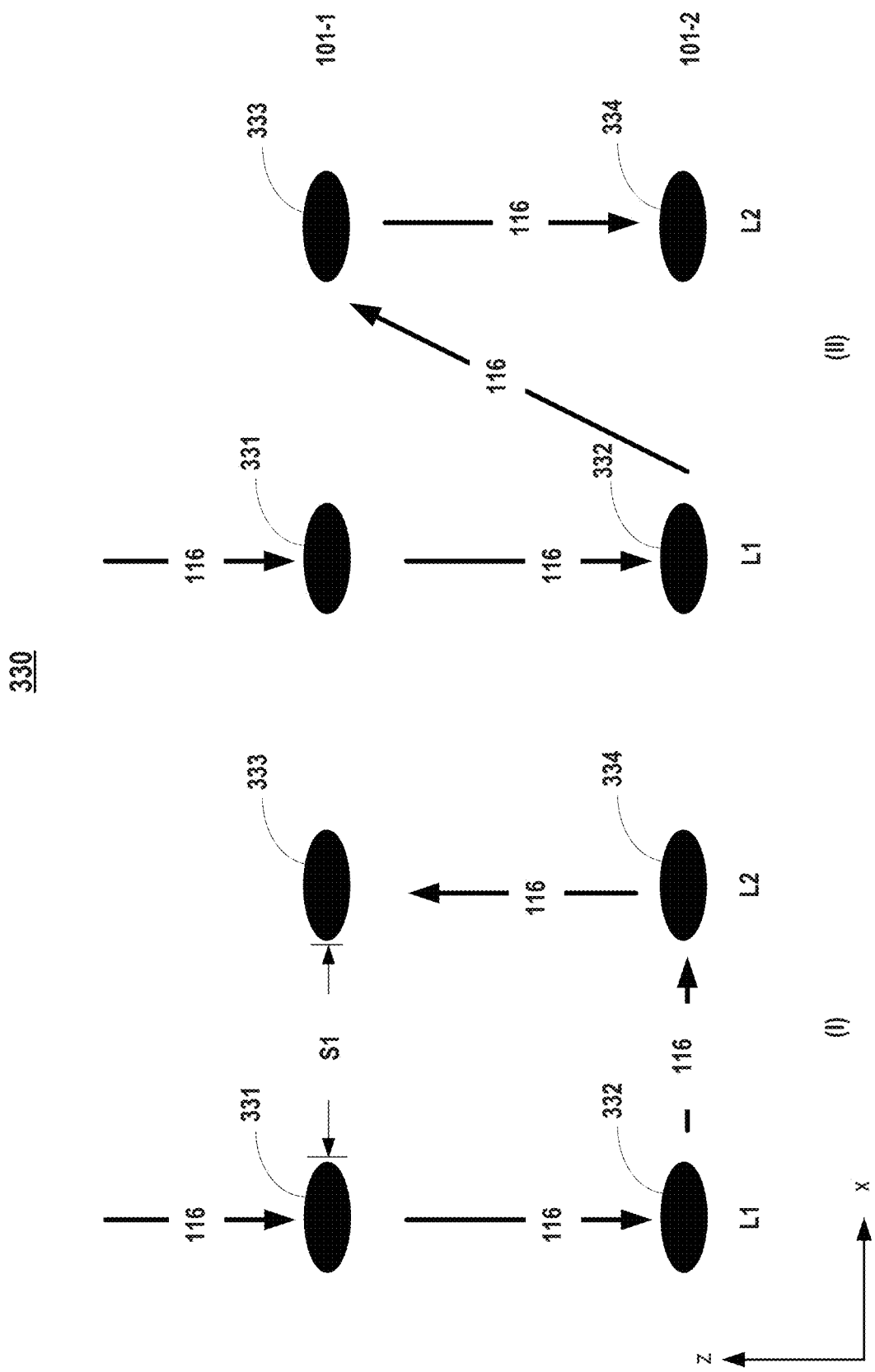
FIG. 3C illustrates exemplary scan patterns to form ablation structures in a laser dicing process, according to some embodiments of the present disclosure.
Figure 3D:
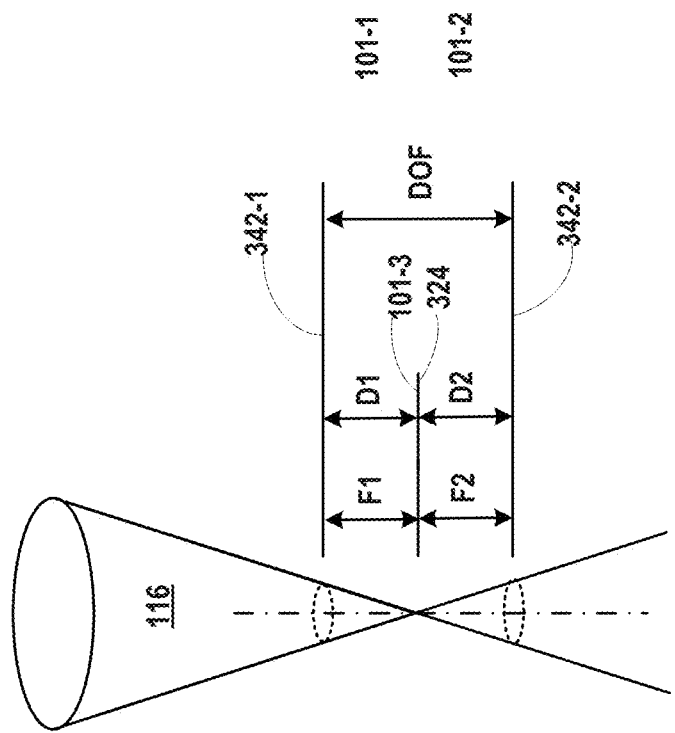
FIG. 3D illustrates a laser beam with a focal plane and a depth of focus, according to some embodiments of the present disclosure.
Figure 3E:
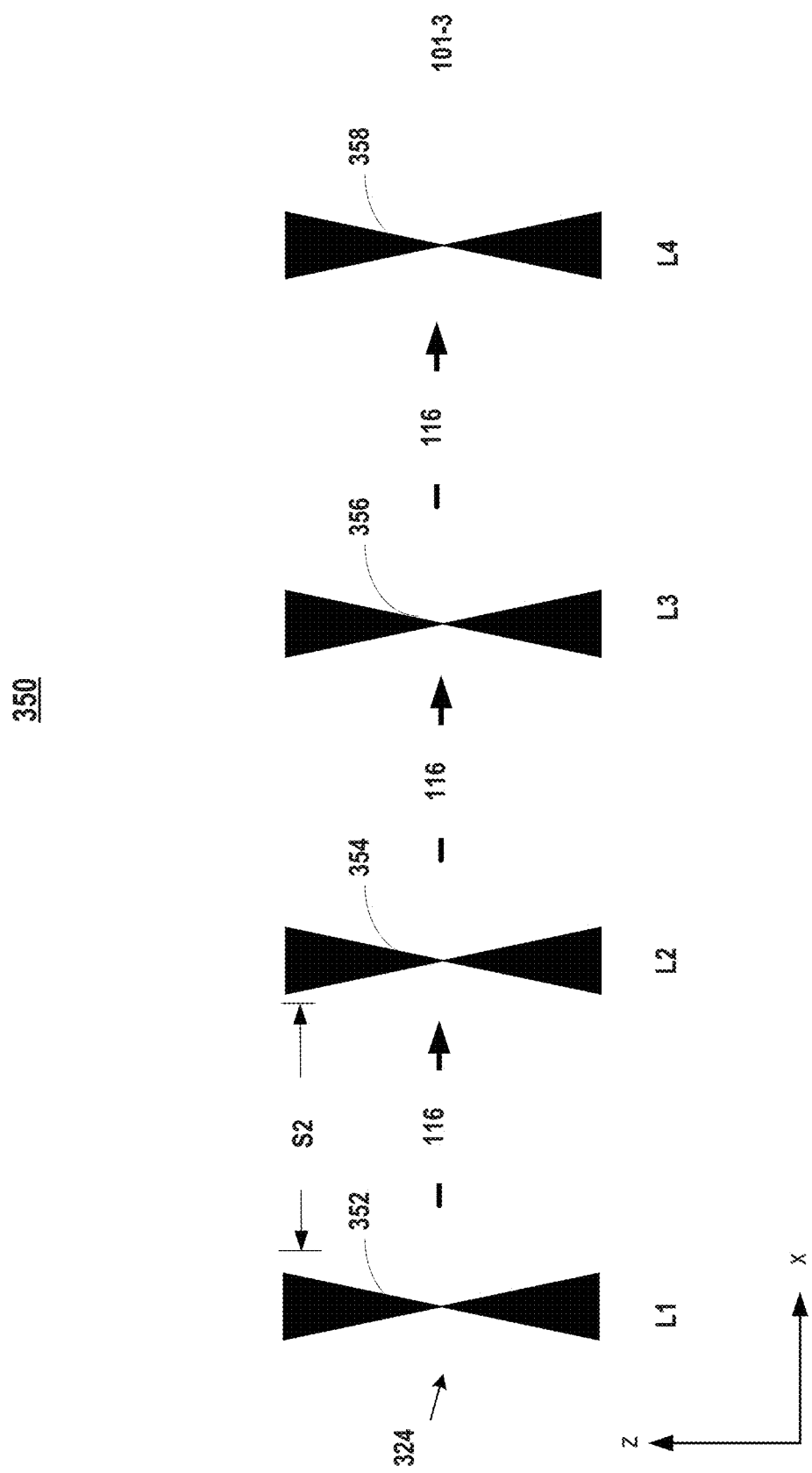
FIG. 3E illustrates another exemplary scan pattern to form ablation structures in a laser dicing process, according to some embodiments of the present disclosure.
Figure 5:
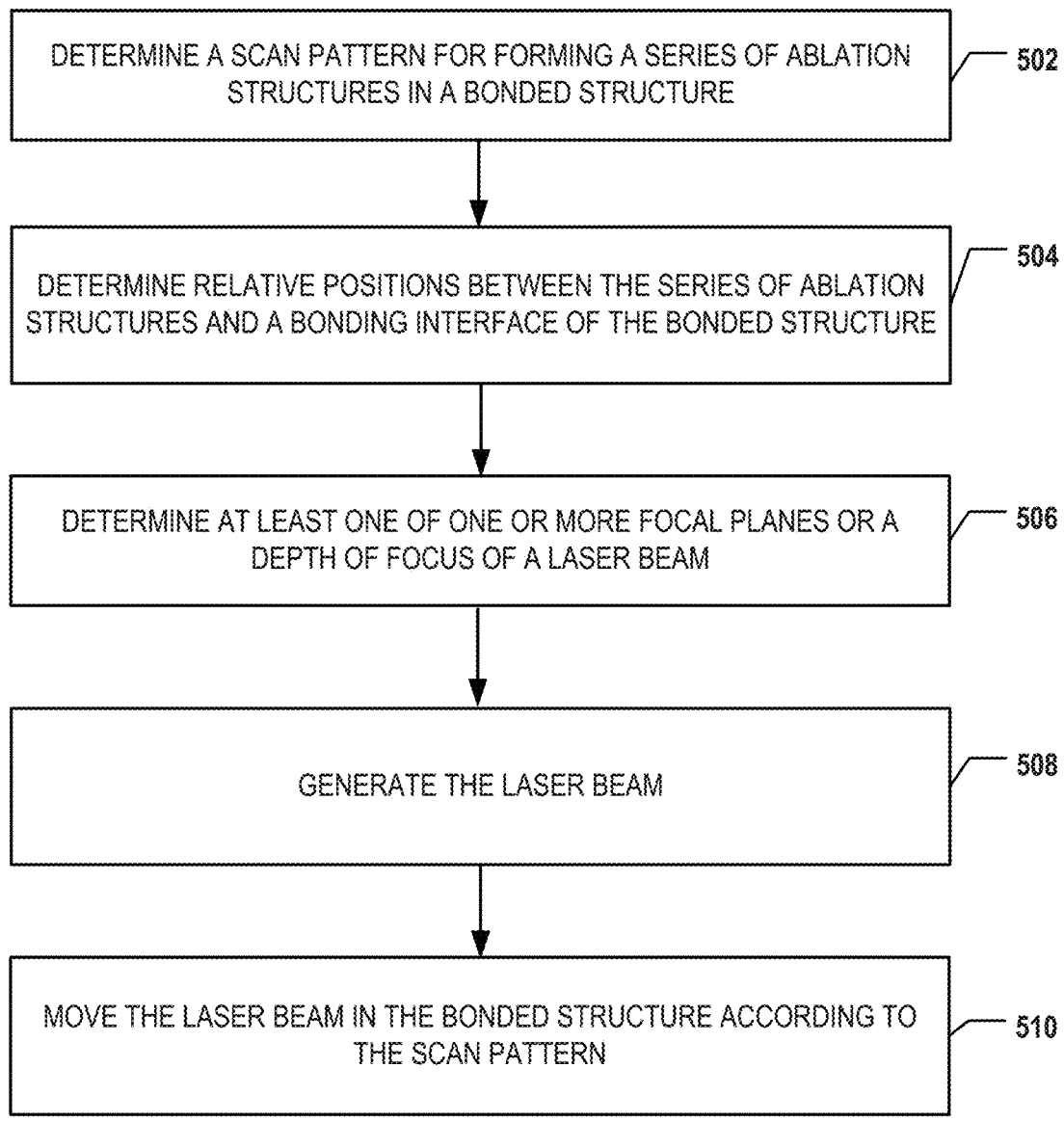
FIG. 5 illustrates a flowchart of a method for dicing a bonded structure, according to some embodiments.

FIGS. 3A and 3B illustrate exemplary laser dicing processes 300 and 320, according to some embodiments. FIG. 3C illustrates scan patterns of a laser dicing process shown in FIG. 3A, according to some embodiments. FIG. 3D illustrates a laser beam having a focal plane and a depth of focus in the laser dicing process shown in FIG. 3B, according to some embodiments. FIG. 3E illustrates a scan pattern of a laser dicing process shown in FIG. 3B, according to some embodiments. FIG. 5 is a flowchart of a method 500 for performing a laser dicing process shown in FIGS. 3A and 3B, according to some embodiments. It is understood that the operations shown in method 500 are not exhaustive and that other operations can be performed as well before, after, or between any of the illustrated operations. Further, some of the operations may be performed simultaneously, or in a different order than shown in FIG. 5. For ease of illustration, laser dicing processes 300 and 320 shown in FIGS. 3A and 3B are described in view of method 500.

Referring to FIG. 5, method 500 starts at operation 502, in which a scan pattern for forming a series of ablation structures in a bonded structure is determined. In some embodiments, the scan pattern includes a path in the horizontal plane (e.g., the x-y plane) between two parts (e.g., two dies) of the bonded structure for a laser beam to move along and form a series of ablation structures in the bonded structure. In some embodiments, the scan pattern is determined by scan pattern determination unit 210 of controller 108 based on, e.g., the dimensions and locations of the two parts.

The bonded structure may be represented by sample 101 of FIG. 1. Specifically, FIGS. 3A and 3B each illustrates the structure of sample 101, according to some embodiments. In some embodiments, sample 101 includes a plurality of wafers bonded along the vertical direction (e.g., the z-axis). For ease of illustration, two wafers, i.e., a first wafer 101-1 and a second wafer 101-2, are shown and described in the present disclosure. First wafer 101-1 and second wafer 101-2 are bonded to contact each other at a bonding interface 101-3. In some embodiments, bonding interface 101-3 extends horizontally (e.g., along the x-axis) between first wafer 101-1 and second wafer 101-2. The scan pattern may include a path that a laser beam 116 converges to form the series of ablation structures in first wafer 101-1 and second wafer 101-2 of sample 101.

Method 500 proceeds to operation 504, in which relative positions between the series of ablation structures and the bonding interface of the bonded structure is determined. The relative positions between the series of ablation structures and the bonding interface can be determined based on factors such as the structure of sample 101 (e.g., the thickness of a wafer), the characteristics of laser source 102 (e.g., the position of a focal plane and/or a depth of focus), and/or any other suitable fabrication requirements (e.g., determined by an operator). In some embodiments, this operation is performed by scan pattern determination unit 210.

FIG. 3A illustrates an exemplary relative position between the series of ablation structures and the bonding interface. In some embodiments, it is determined the series of ablation structures include a plurality of first ablation spots 302-1 aligned horizontally along a first cutting level 306-1 in first wafer 101-1 and a plurality of second ablation spots 302-2 aligned horizontally along a second cutting level 306-2 in second wafer 101-2. For illustrative purposes, a plurality of first ablation spots 302-1 and a plurality of second ablation spots 302-2 are shown as dots in FIG. 3A. Bonding interface 101-3 may be between a plurality of first ablation spots 302-1 and a plurality of second ablation spots 302-2. First cutting level 306-1 may be defined as a level separated by a first cutting depth D1 between plurality of first ablation spots 302-1 and bonding interface 101-3, and second cutting level 306-2 may be defined as a level separated by a second cutting depth D2 between a plurality of second ablation spots 302-2 and bonding interface 101-3. First cutting level 306-1 and second cutting level 306-2 may be the same as or different from each other. First ablation spots 302-1 and second ablation spots 302-2 may be parallel to each other along the vertical direction (e.g., the z-axis). In some embodiments, each of a plurality of first ablation spots 302-1 is aligned with one of a plurality of second ablation spots 302-2 (e.g., a corresponding second ablation spot 302-2) vertically. That is, each first ablation spot 302-1 and a corresponding second ablation spot 302-2 have the same horizontal location (e.g., along the x-axis). In some embodiments, as shown in FIG. 3A, first cutting depth D1 is in a range of about 20 μm to about 40 μm, and second cutting depth D2 is in a range of about 20 μm to about 40 μm, such as 20 μm, 25 μm, 30 μm, 35 μm, 40 μm, any range bounded by the lower end by any of these values, or in any range defined by any two of these values.

FIG. 3B illustrates another exemplary relative position between the series of ablation structures and the bonding interface. In some embodiments, by employing higher pulse laser power and longer depth of focus optics, it is determined the series of ablation structures is realized in one scan. The ablation stripes/grooves 322 aligned along or close to the vertical direction across bonding interface 101-3. The ends of ablation stripes/grooves 322 may be close to cutting level 306-1, and the ends of ablation stripes/grooves 322 may be close to cutting level 306-2. First cutting depth D1 and second cutting depth D2 may be the same as or different from each other. The values of D1 and D2 illustrated in FIG. 3B may be the same as or different from the values of D1 and D2 illustrated in FIG. 3A. In some embodiments, as shown in FIG. 3B, a sum of first cutting depth D1 and second cutting depth D2, i.e., (D1+D2), is in a range of about 20 μm to about 70 μm, such as 20 μm, 25 μm, 30 μm, 35 μm, 40 μm, 45 μm, 50 μm, 55 μm, 60 μm, 65 μm, 70 μm, any range bounded by the lower end by any of these values, or in any range defined by any two of these values. Values of first cutting depth D1 and second cutting depth D2 can respectively be determined based on the range of (D1+D2). For example, first cutting depth D1 is in a range of about 20 μm to about 40 μm and second cutting depth D2 is in a range of about 20 μm to about 40 μm.

Method 500 proceeds to operation 506, as illustrated in FIG. 5, in which at least one of one or more focal planes or the depth of focus of a laser beam are determined. In some embodiments, controller 108 determines one or more focal planes and/or a depth of focus of laser beam 116 based on the distance between laser source 102 and optical module 104, the arrangement of optical components (e.g., lenses) in optical module 104, and a distance between optical module 104 and a cutting level (e.g., first cutting level 306-1 or second cutting level 306-2 in FIG. 3A). In some embodiments, this operation is performed by scan pattern determination unit 210, laser source control unit 212, and optical module control unit 214.

In the example shown in FIG. 3A, it may be determined a first focal plane of laser beam 116 to be nominally coincident with first cutting level 306-1 and a second focal plane of laser beam 116 to be nominally coincident with second cutting level 306-2. Controller 108 may adjust the arrangement of optical components in optical module 104 to converge laser beam 116 respectively on first cutting level 306-1 and second cutting level 306-2 in sample 101. For example, controller 108 may determine distances between laser source 102 and optical module 104 and between optical module 104 and a cutting level (e.g., first cutting level 306-1 or second cutting level 306-2 in FIG. 3A), and adjust the arrangement of optical module 104 based on the distances. In some embodiments, optical module 104 includes one or more focusing lenses, and controller 108 adjusts orientation of a focusing lens and/or a distance between two focusing lenses so that the focal length of laser beam 116 can be shortened to allow the focal plane of laser beam 116 to be nominally coincident with first cutting level 306-1 or enlarged to allow the focal plane of laser beam 116 to be nominally coincident with second cutting level 306-2, in a laser dicing process. Laser beam 116 may be focused respectively on the first focal plane and on the second focal plane to form a plurality of first ablation spots 302-1 in first wafer 101-1 and a plurality of second ablation spots 302-2 in second wafer 101-2.

In some embodiments, controller 108 also determines a power density of laser beam 116 when it converges on the first focal plane and on the second focal plane (e.g., respectively forming a series of focused laser spots at each horizontal location on the respective cutting level). The power density may be sufficiently high to form first ablation spots 302-1 and second ablation spots 302-2. This can be determined by scan pattern determination unit 210, optical module control unit 214, and laser source control unit 212. In some embodiments, for a pulse laser with the pulse width of nanosecond or picosecond levels, the pulse energy of the series of focused laser spots at a focal point (e.g., on a focal plane) is in a range of about 1 µJ to about 30 µJ, such as 5 µJ, 10 µJ, 20 µJ, 30 µJ pulse energy, any range bounded by the lower end by any of these values, or in any range defined by any two of these values.

In the example shown in FIG. 3B, it may be determined the focal plane of laser beam 116 to be coincident with bonding interface 101-3 and the depth of focus of laser beam 116 to cover first cutting level 306-1 and second cutting level 306-2. FIG. 3D illustrates the spatial relationship of focal plane 324, the depth of focus (DOF), bonding interface 101-3, first cutting depth D1, and second cutting depth D2. As shown in FIG. 3D, depth of focus includes a front depth of focus F1 and a rear depth of focus F2. Focal plane 324 may be coincident with bonding interface 101-3. When laser beam 116 converges on focal plane 324, a boundary 342-1 of the front depth of focus F1 may be located in first wafer 101-1, and a boundary 342-2 of the rear depth of focus F2 may be located in second wafer 101-2. First cutting depth D1 may be equal to or less than the front depth of focus F1, and second cutting depth D2 may be less than or equal to the rear depth of focus F2. In some embodiments, first cutting depth D1 is equal to the front depth of focus F1, and second cutting depth D2 is equal to the rear depth of focus F2. When laser beam 116 converges on focal plane 324 (e.g., coincident with bonding interface 101-3), forming a series of focused laser spots at a horizontal location, laser power may distribute vertically in depth of focus DOF to form an ablation stripe/groove 322 in first wafer 101-1 and second wafer 101-2 across bonding interface 101-3. The length of an ablation stripe/groove 322 (e.g., (D1+D2)) may be nominally equal to the depth of focus DOF.

In some embodiments, controller 108 also determines a power density of laser beam 116 when it converges on the focal plane. A series of focused laser spots can be formed at each horizontal location along bonding interface 101-3. The power density may be sufficiently high to form ablation stripe/grooves 322 across bonding interface 101-3 and extending in first wafer 101-1 and second wafer 101-2. This can be determined by scan pattern determination unit 210, optical module control unit 214, and laser source control unit 212. In some embodiments, for a pulse laser with the pulse width of nanosecond or picosecond levels, the pulse energy of the series of focused laser spots at a focal point is in a range of about 1 µJ to about 30 µJ, such as 5 µJ, 10 µJ, 20 µJ, 30 µJ pulse energy, any range bounded by the lower end by any of these values, or in any range defined by any two of these values. In some embodiments, laser source control unit 212 may adjust (e.g., increase) the power output of laser source 102 so desired power density can be reached to form an ablation stripe/groove 322.

Method 500 proceeds to operation 508, as illustrated in FIG. 5, in which the laser beam is generated. In some embodiments, laser beam 116 is generated. Laser beam 116 includes a series of pulsed lasers, which transmits through optical module 104 and converges on a focal plane in sample 101 during a laser dicing process. A series of focused laser spots may be formed, as described previously, on a focal plane (e.g., 302-1, 302-2, and/or 324). In some embodiments, this operation is determined by scan pattern determination unit 210, laser source control unit 212, and optical module control unit 214. In some embodiments, the arrangement of optical module 104 determines the focal plane of laser beam 116.

Method 500 proceeds to operation 510, as illustrated in FIG. 5, in which the laser beam is moved in the sample according to the scan pattern. In some embodiments, the movement of laser beam 116 is caused by horizontal movement of stage 106. When stage 106 moves along a horizontal direction, laser beam 116 moves along an opposite horizontal direction than stage 106 and converges on one or more focal planes to form corresponding ablation structures (e.g., 302 or 322). In some embodiments, a horizontal moving speed of stage 106 is in a range of about 100 mm/second to about 1000 mm/second, causing a horizontal moving speed of laser beam 116 (e.g., along an opposite direction than stage 106) to be about 100 mm/second to about 1000 mm/second. The horizontal moving speed of laser beam 116 may allow sufficient duration time and laser power density of laser beam 116 at each horizontal location to form a desired ablation structure. In some embodiments, the horizontal moving speed of stage 106 is determined based on the power of laser source 102. In some embodiments, the operation is performed by scan pattern determination unit 210, laser source control unit 212, and stage control unit 216.

Referring back to FIG. 3A, to form a plurality of first ablation spots 302-1 and a plurality of second ablation spots 302-2, laser beam 116 (i.e., containing a series of pulsed lasers) may respectively be focused on first focal plane and second focal plane when stage 106 moves. At each horizontal location, laser beam 116 may respectively converge on the first focal plane and the second focal plane, each for a desired duration, to form a first ablation spot 302-1 in first wafer 101-1 and a second ablation spot 302-2 in second wafer 101-2. In some embodiments, first ablation spot 302-1 and second ablation spot 302-2 may be aligned along the vertical direction (e.g., the z-axis). FIG. 3C illustrates exemplary orders 330 in which laser beam 116 converges and forms ablation spots in sample 101.

As shown in example I, laser beam 116 may first be focused on the first focal plane (e.g., coincident with first cutting level 306-1) in first wafer 101-1 for a desired duration. A series of focused laser spots may be formed on first cutting level 306-1 and first ablation spot 331 can be formed in first wafer 101-1 at a first horizontal location L1 (e.g., along the x-axis). Before the relative horizontal movement between laser beam 116 and sample 101 occurs (e.g., caused by horizontal movement of stage 106), laser beam 116 may be re-focused on the second focal plane (e.g., coincide with second cutting level D2) at first horizontal location L1 for a desired duration. A series of focused laser spots may be formed on second cutting level 306-2 and second ablation spot 332 can be formed in second wafer 101-2 at first horizontal location L1. When relative horizontal movement (e.g., along the x-axis) between laser beam 116 and sample 101 occurs, laser beam 116 may be moved to a second horizontal location L2 that is aligned with first horizontal location L1 along the x-axis. A series of focused laser spots may be formed at second horizontal location L2, forming another second ablation spot 334 at second horizontal location L2.

Before the relative horizontal movement between laser beam 116 and sample 101 occurs again, laser beam 116 may be re-focused on the first focal plane at second horizontal location L2 and converge for a desired duration to form another first ablation spot 333 at second horizontal location L2. In some embodiments, first ablation spot 331 and other first ablation spot 333 may be aligned with each other along the x-axis, second ablation spot 332 and other second ablation spot 334 may be aligned with each other along the x-axis, first ablation spot 331 and second ablation spot 332 may be aligned with each other along the z-axis, and other first ablation spot 333 and other second ablation spot 334 may be aligned with each other along the z-axis. In some embodiments, a spacing S1 (e.g., along the x-axis) between first ablation spot 331 and other first ablation spot 333 is in a range of about 0.1 µm to about 5 µm, such as 0.1 µm, 0.5 µm, 1 µm, 3 µm, 5 µm, any range bounded by the lower end by any of these values, or in any range defined by any two of these values.

Ablation spots 331-334 may also be formed in a different order. In another example II, after first ablation spot 331 and second ablation spot 332 are formed at first horizontal location L1, laser beam 116 may be moved to second horizontal location L2 and re-focused on the first focal plane, to form another first ablation spot 333. Another second ablation spot 334 may be formed after laser beam 116 is re-focused on the second focal plane at second horizontal location L2. In some embodiments, ablation spots 331-334 may also be formed in any other suitable orders. For example, second and other second ablation spots 332 and 334 may first be formed at a respective horizontal location before first and other first ablation spots 331 and 333 are formed at these horizontal locations. The specific order to form ablation spots 331-334 should not be limited by the embodiments of the present disclosure.

Laser beam 116 may repeatedly converge on the first focal plane and the second focal plane to form a plurality of first ablation spots 302-1 and a plurality of second ablation spots 302-2. In some embodiments, each first ablation spot 302-1 and a corresponding second ablation spot 302-2 (e.g., at the same horizontal location) are aligned along the z-axis. A plurality of first ablation spots 302-1 and a plurality of second ablation spots 302-2 may each be aligned along the x-axis. In some embodiments, a plurality of first ablation spots 302-1 and plurality of second ablation spots 302-2 may be in the same x-z plane. Sample 101 may subsequently be separated along the vertical plane (e.g., an x-z plane) in which first and second ablation spots 302-1 and 302-2 are located.

Referring back to FIG. 3B, to from a plurality of ablation stripes/grooves 322, laser beam 116 may be focused on focal plane 324 (e.g., coinciding with bonding interface 101-3) and moved along the x-axis. A series of focused laser spots may be formed at a horizontal location along the x-axis. The depth of focus of laser beam 116 may cover first cutting level 306-1 and second cutting level 306-2 when the series of focused laser spots are formed at a horizontal location. The series of focused laser spots may distribute in the depth of focus (e.g., across bonding interface 101-3) at the horizontal location to form an ablation stripe/groove 322 (e.g., extending vertically in the depth of focus of laser beam 116).

FIG. 3E illustrates an exemplary order 350 that laser beam 116 converges and forms ablation stripes/grooves in sample 101. In some embodiments, laser beam 116 may be focused at a first horizontal location L1, forming a series of focused laser spots distributed in depth of focus of laser beam 116. A laser stripe/groove 352 may be formed at first horizontal location L1. When stage 106 moves, the relative horizontal movement between laser beam 116 and sample 101 may cause laser beam 116 to move to a second horizontal location L2 in sample 101, converging and forming an ablation stripe/groove 354. Laser beam 116 may continue to be moved to third and fourth horizontal locations L3 and L4, sequentially forming ablation stripes/grooves 356 and 358. In some embodiments, the first, second, third, and fourth horizontal locations are on bonding interface 101-3, which is coincident with focal plane 324. Each ablation stripe/groove (e.g., 352-358) may be distributed in both first wafer 101-1 and second wafer 101-2. Laser beam 116 may repeatedly be focused on focal plane 324, as stage 106 moves along the x-axis, to form a plurality of ablation stripes/grooves 322 across bonding interface 101-3 and extending in first and second wafers 101-1 and 101-2. In some embodiments, a spacing S2 (e.g., along the x-axis) between adjacent ablation stripes/groves (e.g., 352 and 354) in a range of about 0.1 µm to about 5 µm, such as 0.1 µm, 0.5 µm, 1 µm, 3 µm, 5 µm, any range bounded by the lower end by any of these values, or in any range defined by any two of these values. Sample 101 may subsequently be separated along the vertical plane (e.g., an x-z plane) ablation stripes/grooves 322 are located in.

In the laser dicing processes illustrated in FIGS. 3A and 3B, because the portions of the ablation structures in first wafer 101-1 and second wafer 101-2 are aligned along the vertical direction, the cross-sections formed by a laser dicing operation can be more uniform and consistent than cross-sections formed by a conventional laser dicing process. Fewer damages can be caused to sample 101. Meanwhile, less contamination and less waste area can be formed in sample 101.

Figure 4:
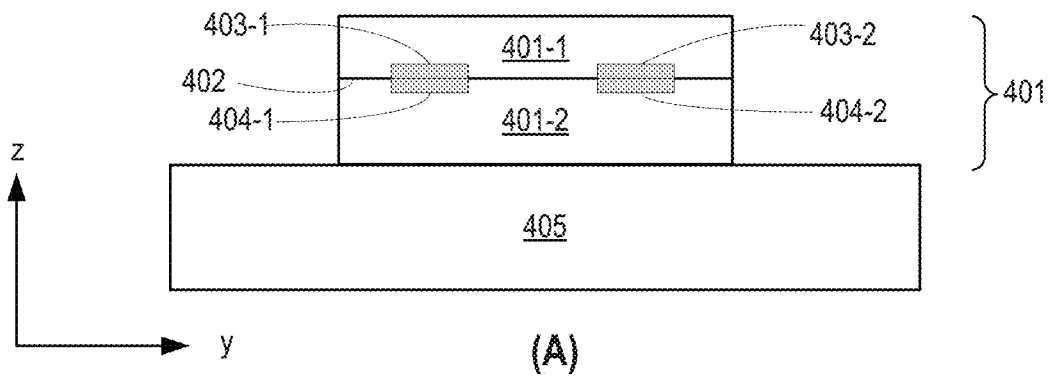
FIG. 4 illustrates an exemplary manufacturing process of a bonded structure, according to some embodiments of the present disclosure.
Figure 4:
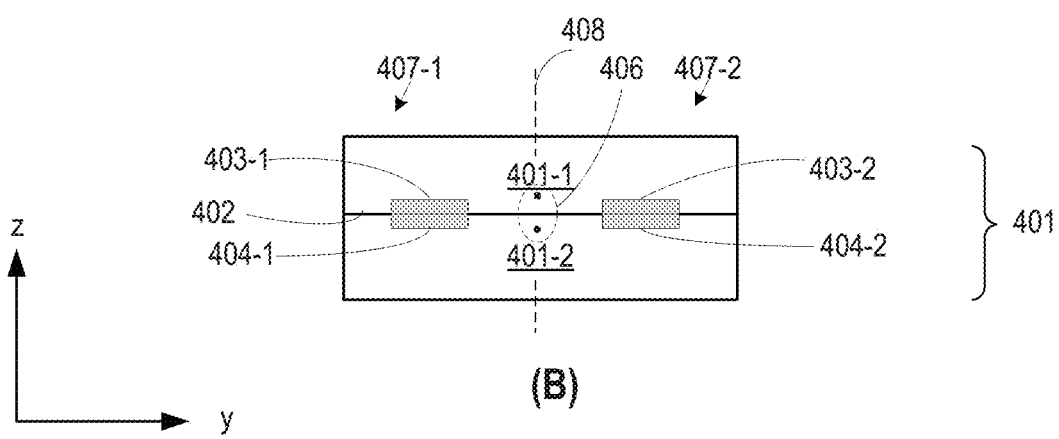
Figure 4:
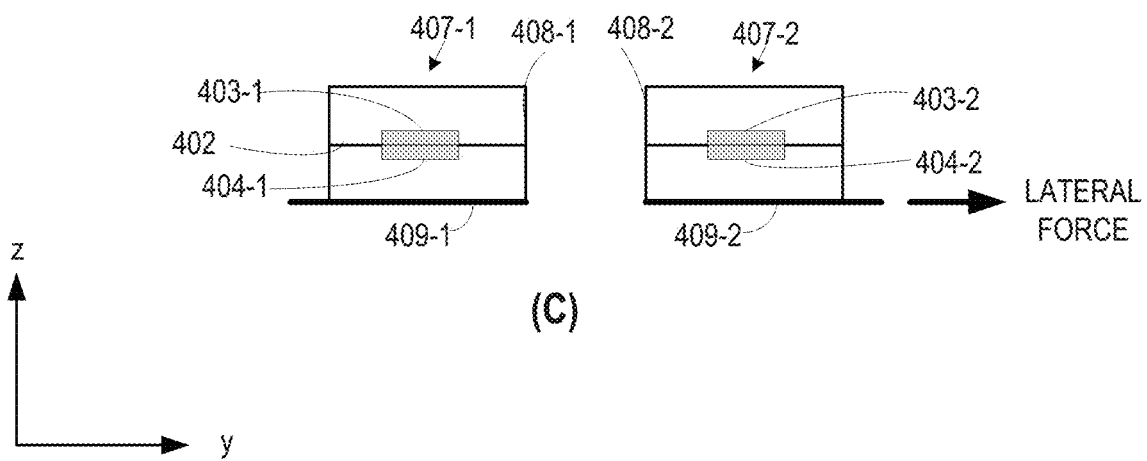
Figure 6:
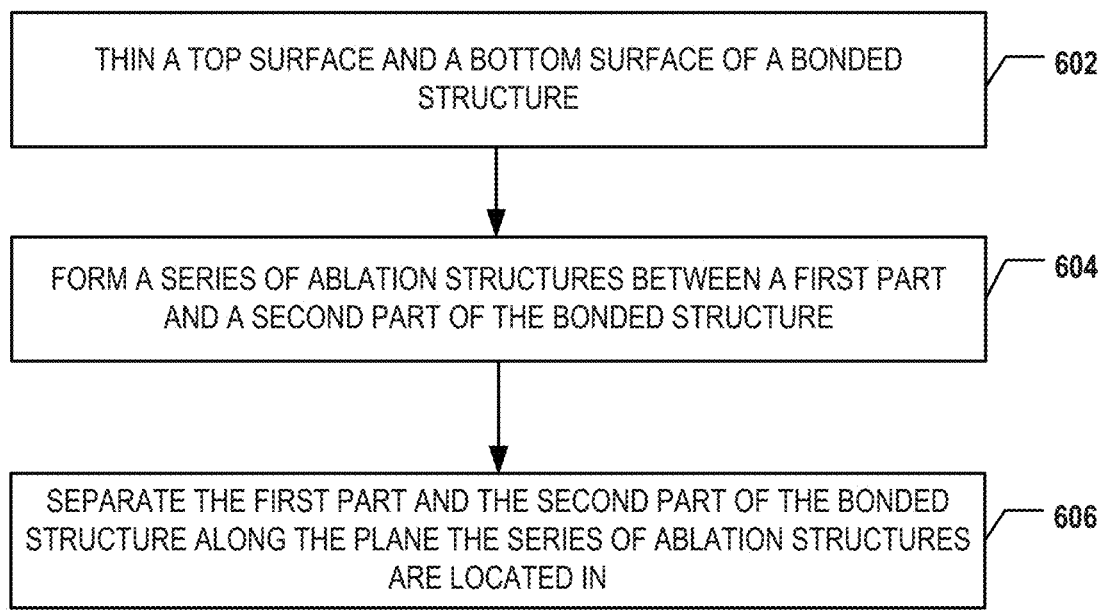
FIG. 6 illustrates a flowchart of a method for manufacturing a bonded structure, according to some embodiments.

FIG. 4 illustrates a laser dicing method 400 with pre-treatment and separation of the parts of a sample, according to some embodiments. FIG. 6 illustrates a flowchart 600 of the laser dicing method shown in FIG. 4. It is understood that the operations shown in method 400 are not exhaustive and that other operations can be performed as well before, after, or between any of the illustrated operations. Further, some of the operations may be performed simultaneously, or in a different order than shown in FIG. 4. For ease of illustration, operations in flowchart 600 are described in view of the fabrication process shown in FIG. 4.

Referring to FIG. 6, method 600 starts at operation 602, in which a top surface and a bottom surface of a bonded structure are thinned. In some embodiments, the top surface of the bonded structure is thinned before the bottom surface. FIG. 4A illustrates a corresponding operation. As shown in FIG. 4A, a bonded structure 401 includes a first wafer 401-1 and a second wafer 401-2 bonded along a bonding interface 402. A first device portion 403-1 and a second device portion 403-2 of first wafer 401-1 may respectively be bonded with a first device portion 404-1 and a second device portion 404-2 of second wafer 401-2. The device portions may include any suitable semiconductor devices/circuits such as a memory array and a peripheral circuit.

A top surface of bonded structure 401 (e.g., the top surface of first wafer 401-1) can first be thinned, e.g., to remove a portion of or the entire substrate of first wafer 401-1. A bottom surface of bonded structure 401 (e.g., the bottom surface of second wafer 401-2) can then be thinned, e.g., to remove a portion of or the entire substrate of second wafer 401-2. A planarization means 405 is depicted to illustrate a thinning process applied on the bottom surface of bonded structure 401. First wafer 401-1 and second wafer 401-2 may each be thinned to a desired thickness along the vertical direction (e.g., the z-axis), which is suitable for a subsequent laser dicing operation. In some embodiments, a thickness of each of first wafer 401-1 and second wafer 401-2 is in a range of about 30 μm to about 80 μm, such as 30 μm, 50 μm, 80 μm, any range bounded by the lower end by any of these values, or in any range defined by any two of these values. In some embodiments, the thickness of each of first wafer 401-1 and second wafer 401-2 is about 50 μm. The top and bottom surfaces of bonded structure 401 may each be thinned by any suitable planarization process (e.g., chemical mechanical planarization) and/or recess etching.

Method 600 proceeds to operation 604, as illustrated in FIG. 6, in which a series of ablation structures are formed in the bonded structure and between a first part and a second part of the bonded structure. FIG. 4B illustrates a corresponding operation. For illustrative purposes, dots are depicted to represent the series of ablation structures 406 distributed along a vertical plane 408 in bonded structure 401.

In some embodiments, ablation structures 406 are formed for separating a first part 407-1 and a second part 407-2 of bonded structure 401. Bonded first device portions 403-1 and 404-1 are located in first part 407-1, and bonded second device portions 403-2 and 404-2 are located in second part 407-2. Ablation structures 406 may be distributed in first wafer 401-1 and second wafer 401-2 and may be aligned along the vertical direction (e.g., the z-axis) in a vertical plane 408. As an example, vertical plane 408 extends along a direction (e.g., the y-axis that is perpendicular to the x-z plane) that separates first part 407-1 and second part 407-2 of bonded structure 401 (e.g., for separating bonded first device portions 403-1 and 404-1 in first part 407-1 and bonded second device portions 403-2 and 404-2 in second part 407-2). In some embodiments, bonded structure 401 is similar to or the same as sample 101 illustrated in FIGS. 3A and 3B, and series of ablation structures 406 may be similar to or the same as ablation spots 302 of FIG. 3A and/or ablation stripes/grooves 322 of FIG. 3B. Detailed descriptions of the process to form a series of ablation structures 406 can be referred to the description of FIGS. 3A-3E and are not repeated herein.

Method 600 proceeds to operation 606, as illustrated in FIG. 6, in which the first part and the second part of the bonded structure are separated along the plane the series of ablation structures are located in. In some embodiments, an adhesive tape is applied on one of the top surface and the bottom surface of the bonded structure to apply a lateral force to separate one of the first and the second parts of the bonded structure from each other. In some embodiments, an adhesive tape can be applied on each of the first part and the second part to apply at least one lateral force on one or more of the first and the second parts. The lateral force can be nominally along a horizontal direction (e.g., a direction perpendicular to the direction series of ablation structures extend). The lateral force can also be a horizontal component of a force that has an angle with the horizontal direction. In some embodiments, the lateral force and the lateral component each is along a horizontal direction pointing away from the plane in which a series of ablation structures 406 are located.

FIG. 4C illustrates a corresponding operation. As shown in FIG. 4C, before first part 407-1 (e.g., a die) and second part 407-2 (e.g., another die) of bonded structure 401 are separated, a first adhesive tape 409-1 is applied on the bottom surface of first part 407-1 and a second adhesive tape 409-2 is applied on the bottom surface of second part 407-2. A lateral force is applied on second adhesive tape 409-2 to pull second part 407-2 away from first part 407-1. As an example, the lateral force points along the y-axis. Bonded structure 401 may then be separated as first part 407-1 and second part 407-2 along vertical plane 408. Cross-sections 408-1 and 408-2, caused by the splitting of bonded structure 401 at vertical plane 408, can accordingly be formed on first and second parts 407-1 and 407-2.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

In some embodiments, a method for dicing a bonded structure includes the following operations. First, a scan pattern can be determined for forming a series of ablation structures in the bonded structure. Relative positions between the series of ablation structures and a bonding interface of the bonded structure can then be determined. The bonding surface may be between a first wafer and a second wafer. At least one of one or more focal planes or a depth of focus of a laser beam may be determined based on the relative positions between the series of ablation structures and the bonding interface. Further, the laser beam may be determined. The laser beam has a series of pulsed lasers. Further, the laser beam may be moved in the bonded structure according to the scan pattern to form the series of ablation structures in the bonded structure.

In some embodiments, determining relative positions between a series of ablation structures and a bonding surface comprises determining a first cutting level in the first wafer and second cutting level in the second wafer of the bonded structure. The first cutting level may be a level away from the bonding interface into the first wafer by a first cutting depth along a vertical direction, and the second cutting level may be a level away from the bonding interface into the second wafer by a second cutting depth along the vertical direction.

In some embodiments, determining a scan pattern for forming a series of ablation structures includes determining a plurality of first ablation spots along the first cutting level and a plurality of second ablation spots along the second cutting level, and determining at least one of a focal plane and a depth of focus includes determining a first focal plane at the first cutting level and a second focal plane at the second cutting level.

In some embodiments, moving the laser beam in the bonded structure according to the scan pattern to form the series of ablation structures in the bonded structure includes converging, at a first horizontal location, the laser beam respectively on the first focal plane and on the second focal plane, to form a first ablation spot in the first wafer at the first cutting level and a second ablation spot in the second wafer at the second cutting level. The first and the second ablation spots may be aligned vertically. The operation also includes converging, at a second horizontal location, the laser beam respectively on the first focal plane and on the second focal plane, to form another first ablation spot in the first wafer at the first cutting level and another second ablation spot in the second wafer at the second cutting level. The first and the other first ablation spots may be aligned horizontally, the second and the other second ablation spots may be aligned horizontally, and the other first and the other second ablation spots may be aligned vertically.

In some embodiments, converging the laser beam at the first focal plane and at the second focal plane includes adjusting an arrangement of an optical module to respectively form a series of focused laser spots on the first focal plane and on the second focal plane.

In some embodiments, forming the other first ablation spot in the first wafer and the other second ablation spot in the second wafer includes one of moving, along the second cutting level, the laser beam horizontally from the first horizontal location to the second horizontal location in the second wafer to converge the laser beam on the second focal plane and form the other second ablation spot in the second wafer. The operation may also include converging, at the second horizontal location, the laser beam on the first focal plane to form the other first ablation spot in the first wafer.

In some embodiments, determining a scan pattern for forming a series of ablation structures includes determining a plurality of ablation stripes extending from the first cutting level to the second cutting level, and determining at least one of a focal plane or a depth of focus includes determining a focal plane on the bonding interface and a depth of focus covering the first cutting level and the second cutting level.

In some embodiments, moving the laser beam in the bonded structure according to the scan pattern to form the series of ablation structures in the bonded structure includes converging the laser beam on the focal plane to form a series of focused laser spots, and moving the series of focused laser spots from a first horizontal location to a second horizontal location along the bonding interface.

In some embodiments, a method for dicing a bonded structure includes thinning a top surface and a bottom surface of a bonded structure. The bonded structure may have a first wafer and a second wafer bonded with a bonding interface. The method may also include forming a series of ablation structures in the first wafer and the second wafer. The series of ablation structures may be between a first part and a second part of the bonded structure. The method may also include separating the first part and the second part of the bonded structure along the series of ablation structures.

In some embodiments, forming a series of ablation structures in the bonded structure includes determining a scan pattern for forming the series of ablation structures in the bonded structure, and determining relative positions between the series of ablation structures and a bonding interface of the bonded structure. The bonding surface may be between a first wafer and a second wafer. The operation may also include determining at least one of one or more focal planes or a depth of focus of a laser beam based on the relative positions between the series of ablation structures and the bonding interface, and generating the laser beam. The laser beam may have a series of pulsed lasers. The operation may further include moving the laser beam in the bonded structure according to the scan pattern to form the series of ablation structures in the bonded structure.

In some embodiments, determining relative positions between a series of ablation structures and a bonding surface includes determining a first cutting level in the first wafer and a second cutting level in the second wafer of the bonded structure. The first cutting level may be a level away from the bonding interface into the first wafer by a first cutting depth along a vertical direction, and the second cutting level may be a distance away from the bonding interface into the second wafer by a second cutting depth along the vertical direction.

In some embodiments, determining a scan pattern for forming a series of ablation structures includes determining a plurality of first ablation spots along the first cutting level and a plurality of second ablation spots along the second cutting level, and determining at least one of one or more focal planes or a depth of focus of a laser beam includes determining a first focal plane at the first cutting level and a second focal plane at the second cutting level.

In some embodiments, moving the laser beam in the bonded structure according to the scan pattern to form the series of ablation structures in the bonded structure includes converging, at a first horizontal location, the laser beam respectively on the first focal plane and on the second focal plane, to form a first ablation spot in the first wafer at the first cutting level and a second ablation spot in the second wafer at the second cutting level. The first and the second ablation spots may be aligned vertically. The operation may also include converging, at a second horizontal location, the laser beam respectively on the first focal plane and on the second focal plane, to form another first ablation spot in the first wafer at the first cutting level and another second ablation spot in the second wafer at the second cutting level. The first and the other first ablation spots may be aligned horizontally, the second and the other second ablation spots may be aligned horizontally, and the other first and the other second ablation spots may be aligned vertically.

In some embodiments, converging the laser beam at the first focal plane and at the second focal plane includes adjusting an arrangement of an optical module to respectively form a series of focused laser spots on the first focal plane and on the second focal plane.

In some embodiments, forming the other first ablation spot in the first wafer and the other second ablation spot in the second wafer includes one of moving, along the second cutting level, the laser beam horizontally from the first horizontal location to the second horizontal location in the second wafer to converge the laser beam on the second focal plane and form the other second ablation spot in the second wafer. The operation may also include converging, at the second horizontal location, the laser beam on the first focal plane to form the other first ablation spot in the first wafer.

In some embodiments, determining a scan pattern for forming a series of ablation structures includes determining a plurality of ablation stripes extending from the first cutting level to the second cutting level, determining at least one of one or more focal planes or a depth of focus of a laser beam includes determining a focal plane on the bonding interface and a depth of focus covering the first cutting level and the second cutting level.

In some embodiments, moving the laser beam in the bonded structure according to the scan pattern to form the series of ablation structures in the bonded structure includes converging the laser beam on the focal plane to form a series of focused laser spots and moving the series of focused laser spots from a first horizontal location to a second horizontal location along the bonding interface.

In some embodiments, separating the first part and the second part of the bonded structure includes applying a lateral force on at least one of the first part or the second part of the bonded structure.

In some embodiments, applying a lateral force on at least one of the first part and the second part of the bonded structure includes applying an adhesive tape on at least one of the first part or the second part of the bonded structure and applying the lateral force on the adhesive tape along a direction pointing away from the series of ablation structures.

In some embodiments, a laser dicing system for dicing a bonded structure includes a laser source configured to generate a series of pulsed lasers, an optical module coupled to the laser source, configured to provide a series of focused laser spots, and a controller coupled to the laser source and the optical module. The controller may be configured to move the series of focused laser spots in the bonded structure to form a series of ablation structures in a first and a second wafers in the bonded structure. The first wafer and a second wafer may have a bonding interface in between.

In some embodiments, the controller is further configured to determine a pattern of the series of ablation structures in the bonded structure, determine relative positions between the series of ablation structures and a bonding interface of the bonded structure, determine at least one of one or more focal planes or a depth of focus of a laser beam based on the relative positions between the series of ablation structures and the bonding interface, generate the laser beam, the laser beam having a laser beam, and move the laser beam in the bonded structure according to the scan pattern to form the series of ablation structures in the bonded structure.

In some embodiments, to determine the relative positions between the series of ablation structures and the bonding surface, the controller is configured to determine a first cutting level in the first wafer and a second cutting level in the second wafer of the bonded structure. The first cutting level may be a level away from the bonding interface into the first wafer along by a first cutting depth a vertical direction, and the second cutting depth may be a distance away from the bonding interface into the second wafer by a second cutting depth along the vertical direction.

In some embodiments, to determine a scan pattern for forming the series of ablation structures, the controller is configured to determine a plurality of first ablation spots along the first cutting level and a plurality of second ablation spots along the second cutting level. To determine at least one of one or more focal planes and a depth of focus of the laser beam, the controller may be configured to determine a first focal plane at the first cutting level and a second focal plane at the second cutting level.

In some embodiments, to move the laser beam in the bonded structure to form the series of ablation structures in the bonded structure, the controller is configured to converge, at a first horizontal location, the laser beam respectively on the first focal plane and on the second focal plane, to form a first ablation spot in the first wafer at the first cutting level and a second ablation spot in the second wafer at the second cutting level. The first and the second ablation spots may be aligned vertically. The controller may also be configured to converge, at a second horizontal location, the laser beam respectively on the first focal plane and on the second focal plane, to form another first ablation spot in the first wafer at the first cutting level and another second ablation spot in the second wafer at the second cutting level. The first and the other first ablation spots may be aligned horizontally, and the second and the other second ablation spots may be aligned horizontally, and the other first and the other second ablation spots being aligned vertically.

In some embodiments, to converge the laser beam at the first focal plane and at the second focal plane, the controller is configured to adjusting an arrangement of an optical module to respectively form a series of focused laser spots on the first focal plane and on the second focal plane.

In some embodiments, to form the other first ablation spot in the first wafer and the other second ablation spot in the second wafer, the controller is configured to move, along the second cutting level, the laser beam horizontally from the first horizontal location to the second horizontal location in the second wafer to converge the laser beam on the second focal plane and form the other second ablation spot in the second wafer. The controller may also be configured to converge, at the second horizontal location, the laser beam on the first focal plane to form the other first ablation spot in the first wafer.

In some embodiments, the first cutting depth is in a range of about 20 μm to about 40 μm and the second cutting depth is in a range of about 20 μm to about 40 μm and a spacing between adjacent first ablation spots and a spacing between adjacent second ablation spots is each in a range of about 10 μm to about 60 μm.

In some embodiments, a pulse energy of the series of the focused laser spots is in a range of about 1 μJ to about 30 μJ pulse energy and a horizontal moving speed of the laser beam is in a range of about 100 mm/second to about 1000 mm/second.

In some embodiments, to determine a scan pattern for forming a series of ablation structures, the controller is configured to determine a plurality of ablation stripes extending from the first cutting level to the second cutting level. To determine at least one of one or more focal planes or a depth of focus of the laser beam, the controller may also be configured to determine a focal plane on the bonding interface and a depth of focus covering the first cutting level and the second cutting level.

In some embodiments, to move the laser beam in the bonded structure to form the series of ablation structures in the bonded structure, the controller is configured to converge the laser beam on the focal plane to form a series of focused laser spots and move the series of focused laser spots from a first horizontal location to a second horizontal location along the bonding interface.

In some embodiments, the first cutting depth is in a range of about 20 μm to about 40 μm and the second cutting depth is in a range of about 20 μm to about 40 μm and a spacing between adjacent first ablation spots and a spacing between adjacent second ablation spots is each in a range of about 10 µm to about 60 µm.

In some embodiments, a power density of the series of the focused laser spots is in a range of about 1 µJ to about 30 µJ pulse energy and a horizontal moving speed of the laser beam is in a range of about 100 mm/second to about 1000 mm/second.

In some embodiments, the depth of focus of the laser source is in a range of about 20 µm to about 70 µm.

In some embodiments, a spacing between adjacent ablation stripes is in a range of about 10 µm to about 60 µm.

In some embodiments, a thickness of the first wafer and the second wafer is each in range of about 30 µm to about 80 µm.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for dicing a bonded structure, comprising:
   determining, by a controller, a scan pattern for forming a series of ablation structures in the bonded structure, the series of ablation structures comprising one or more first cuttings in a first wafer and one or more second cuttings in a second wafer, and each of the one or more first cuttings corresponding to one of the one or more second cuttings;
   determining, by the controller, relative positions between the series of ablation structures and a bonding interface of the bonded structure, comprising determining positional relationships of the one or more first cuttings and the one or more second cuttings with respect to the bonding interface between the first wafer and the second wafer, the positional relationships comprising a first cutting depth between the one or more first cuttings and the bonding interface and a second cutting depth between the one or more second cuttings and the bonding interface;
   determining, by the controller, at least one of one or more focal planes or a depth of focus of a laser beam based on the relative positions between the series of ablation structures and the bonding interface, comprising one of:
      determining a first focal plane nominally coincident with a first cutting level of the one or more first cuttings and a second focal plane nominally coincident with a second cutting level of the one or more second cuttings based on the bonding interface, the first cutting depth, and the second cutting depth; and
      determining a third focal plane nominally coincident with the bonding interface and the depth of focus covering the first cutting level and the second cutting level based on the first cutting depth and the second cutting depth;
   generating, by a laser source, the laser beam, the laser beam having a series of pulsed lasers; and
   moving, by the controller, the laser beam in the bonded structure according to the scan pattern to form the series of ablation structures in the bonded structure.

2. The method of claim 1, wherein determining the relative positions between the series of ablation structures and the bonding interface further comprises determining the first cutting level of the one or more first cuttings in the first wafer and the second cutting level of the one or more second cuttings in the second wafer, the first cutting level being a level away from the bonding interface into the first wafer by the first cutting depth along a vertical direction, the second cutting level being a level away from the bonding interface into the second wafer by the second cutting depth along the vertical direction.

3. The method of claim 2, wherein:
   determining the scan pattern for forming the series of ablation structures comprises determining a plurality of first ablation spots along the first cutting level and a plurality of second ablation spots along the second cutting level; and
   determining the at least one of the one or more focal planes or the depth of focus comprises determining the first focal plane at the first cutting level and the second focal plane at the second cutting level.

4. The method of claim 3, wherein moving the laser beam in the bonded structure according to the scan pattern to form the series of ablation structures in the bonded structure comprises:
   converging, at a first horizontal location, the laser beam respectively on the first focal plane and on the second focal plane, to form a first ablation spot in the first wafer at the first cutting level and a second ablation spot in the second wafer at the second cutting level, the first and the second ablation spots being aligned vertically; and
   converging, at a second horizontal location, the laser beam respectively on the first focal plane and on the second focal plane, to form another first ablation spot in the first wafer at the first cutting level and another second ablation spot in the second wafer at the second cutting level, the first and the other first ablation spots being aligned horizontally, the second and the other second ablation spots being aligned horizontally, and the other first and the other second ablation spots being aligned vertically.

5. The method of claim 4, wherein converging the laser beam at the first focal plane and at the second focal plane comprises adjusting an arrangement of an optical module to respectively form a series of focused laser spots on the first focal plane and on the second focal plane.

6. The method of claim 5, wherein forming the other first ablation spot in the first wafer and the other second ablation spot in the second wafer comprises one of:
   moving, along the second cutting level, the laser beam horizontally from the first horizontal location to the second horizontal location in the second wafer to converge the laser beam on the second focal plane and form the other second ablation spot in the second wafer; and
   converging, at the second horizontal location, the laser beam on the first focal plane to form the other first ablation spot in the first wafer.

7. The method of claim 2, wherein:
   determining the scan pattern for forming the series of ablation structures comprises determining a plurality of ablation stripes extending from the first cutting level to the second cutting level; and
   determining the at least one of the one or more focal planes or the depth of focus comprises determining the third focal plane on the bonding interface and the depth of focus covering the first cutting level and the second cutting level.

8. The method of claim 7, wherein moving the laser beam in the bonded structure according to the scan pattern to form the series of ablation structures in the bonded structure comprises:
   converging the laser beam on the third focal plane to form a series of focused laser spots; and
   moving the series of focused laser spots from a first horizontal location to a second horizontal location along the bonding interface.

9. A laser dicing system for dicing a bonded structure, comprising:
   a laser source configured to generate a series of pulsed lasers;
   an optical module coupled to the laser source, configured to provide a series of focused laser spots; and
   a controller coupled to the laser source and the optical module, configured to:
      determine relative positions between a series of ablation structures and a bonding interface of the bonded structure, comprising determining positional relationships of one or more first cuttings and one or more second cuttings with respect to the bonding interface between a first wafer and a second wafer, the positional relationships comprising a first cutting depth between the one or more first cuttings and the bonding interface and a second cutting depth between the one or more second cuttings and the bonding interface, and the series of ablation structures comprising the one or more first cuttings in the first wafer and the one or more second cuttings in the second wafer, and each of the one or more first cuttings corresponding to one of the one or more second cuttings;
      determine at least one of one or more focal planes or a depth of focus of a laser beam based on the relative positions between the series of ablation structures and the bonding interface, comprising one of:
         determining a first focal plane nominally coincident with a first cutting level of the one or more first cuttings and a second focal plane nominally coincident with a second cutting level of the one or more second cuttings based on the bonding interface, the first cutting depth, and the second cutting depth; and
         determining a third focal plane nominally coincident with the bonding interface and the depth of focus covering the first cutting level and the second cutting level based on the first cutting depth and the second cutting depth; and
      move the series of focused laser spots in the bonded structure to form the series of ablation structures in the first wafer and the second wafer in the bonded structure.

10. The laser dicing system of claim 9, wherein the controller is further configured to:
    determine a scan pattern of the series of ablation structures in the bonded structure;
    generate the laser beam, the laser beam having the series of pulsed lasers; and
    move the laser beam in the bonded structure according to the scan pattern to form the series of ablation structures in the bonded structure.

11. The laser dicing system of claim 10, wherein to determine the relative positions between the series of ablation structures and the bonding interface, the controller is configured to determine the first cutting level of the one or more first cuttings in the first wafer and the second cutting level of the one or more second cuttings in the second wafer of the bonded structure, the first cutting level being a level away from the bonding interface into the first wafer along by the first cutting depth a vertical direction, the second cutting level being a distance away from the bonding interface into the second wafer by the second cutting depth along the vertical direction.

12. The laser dicing system of claim 11, wherein:
    the first cutting depth is in a range of about 20 µm to about 40 µm and the second cutting depth is in a range of about 20 µm to about 40 µm;
    a spacing between adjacent first ablation spots and a spacing between adjacent second ablation spots is each in a range of about 10 µm to about 60 µm, the one or more first cuttings comprising the first ablation spots, and the one or more second cuttings comprising the second ablation spots;
    a power density of the series of focused laser spots is in a range of about 1 µJ to about 30 µJ pulse energy; and
    a horizontal moving speed of the laser beam is in a range of about 100 mm/second to about 1000 mm/second.

13. The laser dicing system of claim 10, wherein:
    to determine the scan pattern for forming the series of ablation structures, the controller is configured to determine a plurality of ablation stripes extending from the first cutting level to the second cutting level; and
    to determine the at least one of the one or more focal planes or the depth of focus of the laser beam, the controller is configured to determine the third focal plane on the bonding interface and the depth of focus covering the first cutting level and the second cutting level.

14. The laser dicing system of claim 13, wherein:
    the depth of focus of the laser beam is in a range of about 20 µm to about 70 µm; and
    a spacing between adjacent ablation stripes is in a range of 10 µm to about 60 µm.

15. The laser dicing system of claim 14, wherein a thickness of the first wafer and the second wafer is each in range of about 30 µm to about 80 µm.

16. The method of claim 1, wherein:

the one or more first cuttings comprise a plurality of first ablation spots aligned horizontally along the first cutting level, and the one or more second cuttings comprise a plurality of second ablation spots aligned horizontally along the second cutting level; and each of the plurality of first ablation spots corresponds to one of the plurality of second ablation spots.

17. The method of claim 1, wherein:

the one or more first cuttings comprise a plurality of first ablation grooves aligned vertically with respect to the bonding interface, and the one or more second cuttings comprise a plurality of second ablation grooves aligned vertically with respect to the bonding interface; and each of the plurality of first ablation grooves corresponds to one of the plurality of second ablation grooves to form an ablation stripe aligned along a vertical direction across the bonding interface.

18. The laser dicing system of claim 9, wherein:

the one or more first cuttings comprise a plurality of first ablation spots aligned horizontally along the first cutting level, and the one or more second cuttings comprise a plurality of second ablation spots aligned horizontally along the second cutting level; and each of the plurality of first ablation spots corresponds to one of the plurality of second ablation spots.

19. The laser dicing system of claim 9, wherein:

the one or more first cuttings comprise a plurality of first ablation grooves aligned vertically with respect to the bonding interface, and the one or more second cuttings comprise a plurality of second ablation grooves aligned vertically with respect to the bonding interface; and each of the plurality of first ablation grooves corresponds to one of the plurality of second ablation grooves to form an ablation stripe aligned along a vertical direction across the bonding interface.

20. A method for dicing a bonded structure, comprising:

determining, by a controller, a scan pattern for forming a series of ablation structures in the bonded structure, the series of ablation structures comprising one or more first cuttings in a first wafer and one or more second cuttings, each corresponding to one of the one or more first cuttings, in a second wafer, and the series of ablation structures being arranged between a first part and a second part of the bonded structure;

determining, by the controller, a first positional relationship of the one or more first cuttings with respect to a bonding interface and a second positional relationship of the one or more second cuttings with respect to the bonding interface, the bonding interface being positioned between the first wafer and the second wafer, the first positional relationship comprising a first cutting depth between the one or more first cuttings and the bonding interface, and the second positional relationship comprising a second cutting depth between the one or more second cuttings and the bonding interface;

determining, by the controller, at least one of one or more focal planes or a depth of focus of a laser beam based on the first positional relationship and the second positional relationship, comprising one of:

determining a first focal plane nominally coincident with a first cutting level of the one or more first cuttings and a second focal plane nominally coincident with a second cutting level of the one or more second cuttings based on the bonding interface, the first cutting depth, and the second cutting depth; and determining a third focal plane nominally coincident with the bonding interface and the depth of focus covering the first cutting level and the second cutting level based on the first cutting depth and the second cutting depth;

generating, by a laser source, the laser beam, the laser beam having a series of pulsed lasers; and moving, by the controller, the laser beam in the bonded structure according to the scan pattern to form the series of ablation structures in the bonded structure, wherein the first part and the second part of the bonded structure are separated along the series of ablation structures.

\* \* \* \* \*